United States Patent [19]
Mikami et al.

[11] Patent Number: 5,406,224
[45] Date of Patent: Apr. 11, 1995

[54] CIRCUIT FOR STABILIZING RF AMPLIFIER

[75] Inventors: Seishin Mikami, Toyota; Masao Kodera, Okazaki; Junshi Utsu, Nagoya, all of Japan

[73] Assignee: Nippondenso Co., Ltd., Kariya, Japan

[21] Appl. No.: 111,120

[22] Filed: Aug. 24, 1993

[30] Foreign Application Priority Data

Aug. 25, 1992 [JP] Japan .................. 4-226085

[51] Int. Cl.$^6$ .............. H03F 3/16; H03F 3/60; H03F 3/191
[52] U.S. Cl. .................. 330/277; 330/286; 330/302
[58] Field of Search ............. 330/277, 286, 302, 303, 330/306

[56] References Cited

U.S. PATENT DOCUMENTS 5,089,790 2/1992 Mochizuchi et al. .......... 330/306 X

FOREIGN PATENT DOCUMENTS 53-54454 5/1978 Japan .
4301906 10/1992 Japan ...................... 330/286

OTHER PUBLICATIONS

"Microwave Transistor Amplifiers", pp. 84–87 & pp. 95–102 no date.

"Transmission Circuit" by R. Sato; pp. 29–87 (w/partial English translation) no date.

*Primary Examiner*—Steven Mottola
*Attorney, Agent, or Firm*—Cushman, Darby & Cushman

[57] ABSTRACT

A high-frequency amplifier has a semiconductor element for amplifying a high-frequency signal, an input matching circuit connected to an input side of the semiconductor element, and an output matching circuit connected to an output side of the semiconductor element. A stabilizing circuit is connected to at least one of a signal input path between the input matching circuit and the semiconductor element, and a signal output path between the semiconductor element and the output matching circuit. The stabilizing circuit includes a first element having a first end which is short-circuited with respect to a high frequency, a parallel resonant circuit connected in series with a second end of the first element and performing parallel resonance at an operating frequency of the high-frequency amplifier, and a second element connected to a side of the parallel resonant circuit which is opposite to the first element. Values of the first element and the second element are chosen so that an admittance of the high-frequency amplifier which occurs at a frequency of possible oscillation of the high-frequency amplifier will be within a constant-conductance circle in a Smith chart which denotes a stable condition of the high-frequency amplifier.

10 Claims, 6 Drawing Sheets

CIRCUIT FOR STABILIZING RF AMPLIFIER

BACKGROUND OF THE INVENTION

1. Field of the Invention

This invention relates to a circuit for stabilizing an RF (radio-frequency) amplifier such as a microwave amplifier.

2. Description of the Prior Art

A typical microwave amplifier includes an FET, and input and output matching circuits connected to the FET. The drain of the FET is connected to a bias power supply so that the FET can be fed with a bias current from the bias power supply. An inductor is connected between the drain of the FET and the bias power supply to prevent a microwave signal from leaking toward the bias power supply.

Generally, in such a microwave amplifier, the source of the FET is grounded via an inductor which enables a reduced noise figure at an operating frequency, that is, a frequency of a signal handled by the amplifier. As the inductance of the noise-reducing inductor increases, the noise figure of the amplifier decreases. However, the amplifier tends to oscillate at a high inductance of the noise-reducing inductor.

To prevent such oscillation corresponding to the amplifier and thereby increase the stability thereof, it is known to connect a damping resistor to the FET. A book entitled "MICROWAVE TRANSISTOR AMPLIFIERS", written by Guillermo Gonzales and published by PRENTICE-HALL, INC., teaches that the resistance of the damping resistor should be within a given stability circle (a given constant-conductance circle) in a Smith chart.

There are three examples of such a damping resistor. The first example is a series resistor connected to the gate of the FET. The second example is a series resistor connected to the drain of the FET. The third example is a shunt resistor connected between the drain and the source of the FET.

The admittance of the damping resistor is fixed independent of frequency. Therefore, in some cases, the damping resistor tends to have a excessively large conductance with respect to a signal in a frequency band predetermined for the amplifier. The excessively large conductance results in a reduction in the gain of the amplifier and an increase in the noise figure of the amplifier.

SUMMARY OF THE INVENTION

It is an object of this invention to provide an improved circuit for stabilizing an RF amplifier.

A first aspect of this invention provides a stabilizing circuit for a high-frequency amplifier having a semiconductor element for amplifying a high-frequency signal, an input matching circuit connected to an input side of the semiconductor element, and an output matching circuit connected to an output side of the semiconductor element. The stabilizing circuit is connected to at least one of a signal input path between the input matching circuit and the semiconductor element and a signal output path between the semiconductor element axed the output matching circuit. The stabilizing circuit comprises a first element having a first end which is short-circuited with respect to a high frequency; a parallel resonant circuit connected in series with a second end of the first element and performing parallel resonance at an operating frequency of the high-frequency amplifier; and a second element connected to a side of the parallel resonant circuit which is opposite to the first element. Values of the first element and the second element are chosen so that an admittance of the high-frequency amplifier which occurs at a frequency of possible oscillation of the high-frequency amplifier will be within a constant-conductance circle in a Smith chart which denotes a stable condition of the high-frequency amplifier.

A second aspect of this invention provides a microwave amplifier comprising an FET having a source and a drain; an output matching circuit connected to the drain of the FET; and a stabilizing circuit. The stabilizing circuit includes a first element composed of one of a resistor and an inductor, a second element composed of one of a resistor and an inductor, a parallel resonant circuit connected via the first element to a junction between the drain of the FET and the output matching circuit, and means for coupling a second end of the second element to the source of the FET parallel resonant circuit is connected to a first end of the second element, and tuned to a predetermined microwave frequency.

DESCRIPTION OF THE FIRST PREFERRED EMBODIMENT

Figure 1:
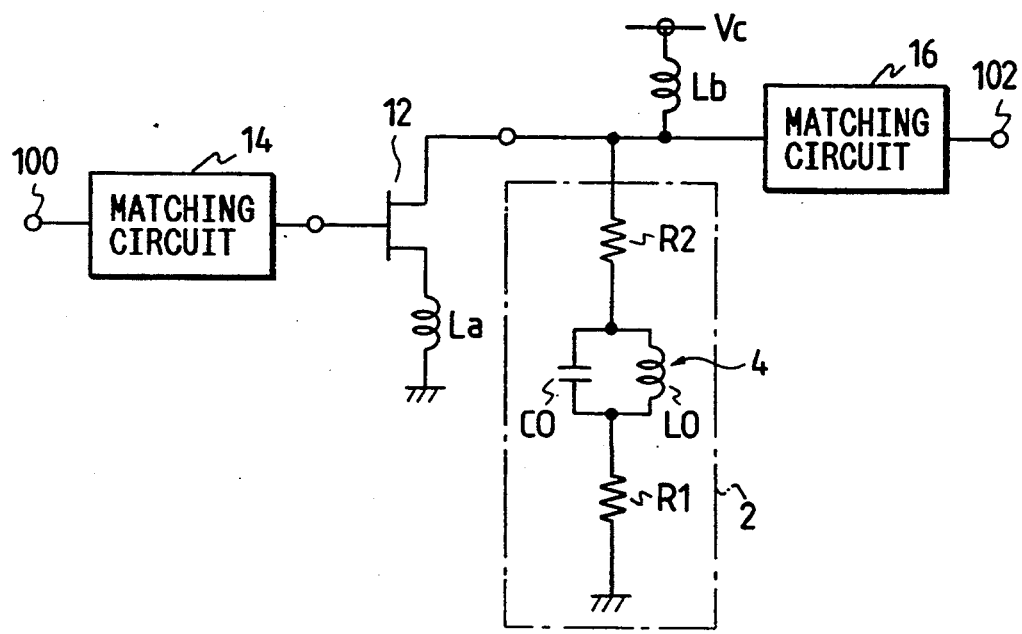
FIG. 1 is a diagram of a microwave amplifier according to a first embodiment of this invention.

With reference to FIG. 1, a microwave amplifier includes an FET (field effect transistor) 12, am input matching circuit 14, and an output matching circuit 16.

The input matching circuit 14 is connected between an input terminal 100 and the gate of the FET 12. The output matching circuit 16 is connected between the drain of the FET 12 and an output terminal 102.

The drain of tile FET 12 is connected via an inductor Lb to a power supply line (bias supply line) subjected to a power supply voltage (bias voltage) Vc. The inductor Lb prevents a microwave signal from leaking toward the power supply line. The source of the FET 12 is grounded via an inductor La which serves to reduce the noise figure of the amplifier.

One end of a stabilizing circuit 2 is connected to the drain of the FET 12. The other end of the stabilizing circuit 2 is grounded. The stabilizing circuit 2 serves to prevent unwanted oscillation of the amplifier without impairing the amplification characteristics thereof.

The stabilizing circuit 2 includes fixed resistors R1 and R2, a capacitor C0, and an inductor L0. The capacitor C0 and the inductor L0 are connected in parallel to compose a parallel resonant circuit 4. The resonance frequency of the parallel resonant circuit 4 is preset to a given frequency f0 which agrees with the frequency of a microwave signal handled by the amplifier. A first junction between the capacitor C0 and the inductor L0 is connected via the resistor R2 to the drain of the FET 12. A second junction between the capacitor C0 and the inductor L0 is grounded via the resistor R1.

In the stabilizing circuit 2, the parallel resonant circuit 4 resonates at the preset frequency f0. Thus, tile admittance of the stabilizing circuit 2 which occurs at the preset frequency f0 corresponds to the point "A" on the outermost circle in a Smith chart of FIG. 2.

In other words, the parallel resonant circuit 4 causes the stabilizing circuit 2 to exhibit a high impedance at the preset frequency f0. Thus, at the preset frequency f0, the stabilizing circuit 2 hardly affects the amplification characteristics, such as the gain and the noise figure, of the amplifier.

Figure 2:
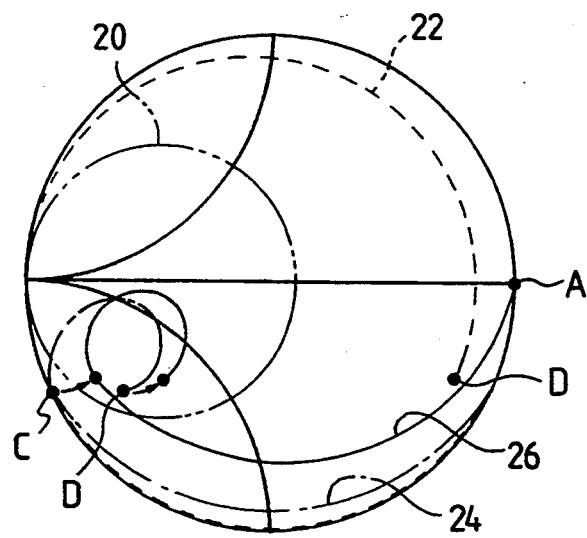
FIG. 2 is an admittance Smith chart in the amplifier of FIG. 1.

In FIG. 2, the numeral "20" denotes a constant-conductance circle which defines a good stability region. To prevent unwanted oscillation of the amplifier and thereby enable stable operation thereof, it is preferable that the admittance of the stabilizing circuit 2 which occurs at the preset frequency f0 exists within the constant-conductance circle 20. Suitable setting of the resistors R1 and R2 enable the admittance to exist within the constant-conductance circle 20 as will be made clear later.

The constant-conductance circle 20 is determined by known methods such as disclosed in the previously-mentioned book "MICROWAVE TRANSISTOR AMPLIFIERS". In addition, the reason why unwanted oscillation of the amplifier can be prevented by this design is suggested in the book "MICROWAVE TRANSISTOR AMPLIFIERS".

Figure 4:
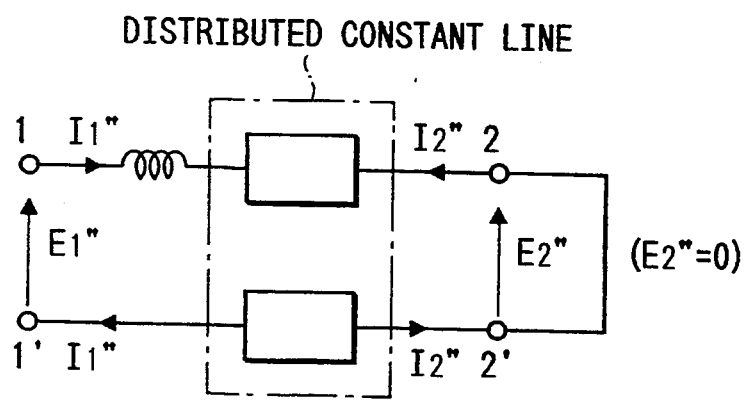
FIG. 4 is a diagram of an equivalent circuit of an inductor within a parallel resonant circuit.

In the parallel resonant circuit 4, the inductor L0 has a certain line length. Thus, the inductor L0 has characteristics as a transmission line (distributed constant line). The equivalent circuit of the inductor L0 is shown in FIG. 4. As the frequency increases above the preset frequency f0, the point of the admittance $\Gamma 1$ of the parallel resonant circuit 4 rotates clockwise and moves inward along the admittance locus 22 in the Smith chart of FIG. 2 due to a line loss.

When a load is connected to the output of a two-port network, the input reflection coefficient $\Gamma IN$ is given as (see the equation 2.7.1 in the book "MICROWAVE TRANSISTOR AMPLIFIERS"):

$$\Gamma IN = S11 + \{(S12 \cdot S21 \cdot \Gamma L)/(1 - S22 \cdot \Gamma L)\}$$

Since the admittance $\Gamma 2$ of the series combination of the resistor R1 and the parallel resonant circuit 4 is approximated to the input reflection coefficient $\Gamma IN$, it is substantially expressed by the following equation.

$$\Gamma 2 = S11 + \{(S12 \cdot S21 \cdot \Gamma 4)/(1 - S22 \cdot \Gamma 4)\} \tag{1}$$

where $\Gamma 4$ denotes the reflection coefficient of the resistor R1, and S11, S12, S21, and S22 denote the S-parameters of the parallel resonant circuit 4.

As is made clear from FIG. 2, the series connection of the resistor R1 to the parallel resonant circuit 4 results in movement of the admittance $\Gamma 1$ of the parallel resonant circuit 4 toward a high conductance side. There is a point, such as the point "C" in FIG. 2, at which the admittance $\Gamma 2$ of the series combination of the resistor R1 and the parallel resonant circuit 4 does not shift from the admittance $\Gamma 1$ of the parallel resonant circuit 4.

Figure 3:
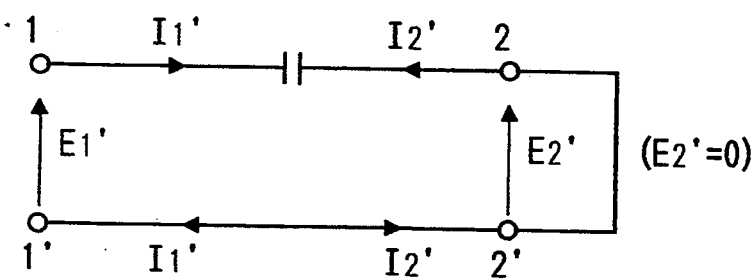
FIG. 3 is a diagram of an equivalent circuit of a capacitor within a parallel resonant circuit.

The reason for this fact will be described hereinafter. With reference to FIG. 3 showing a two-port circuit having the capacitor C0, y-parameters $y11'$ and $y12'$ of the two-port circuit are given as follows (see the equation 2.17 and the equation 2.20 in a Japanese book entitled "DENSO KAIRO" which means "TRANSMISSION CIRCUIT").

$$y11' = (I1'/E1')_{E2'=0} \tag{2}$$

$$y12' = -(I2'/E1')_{E2'=0} \tag{3}$$

Since $I1' = -I2'$ as suggested in FIG. 3, it is understood from the equations (2) and (3) that the y-parameters $y11'$ and $y12'$ of the capacitor C0 have the following relation.

$$y11' = y12' \tag{4}$$

With reference to FIG. 4 showing a two-port circuit having the inductor L0 (the equivalent circuit of the inductor L0), y-parameters $y11''$ and $y12''$ of the two-port circuit are given as follows (see the equation 2.17 and the equation 2.20 in the Japanese book "DENSO KAIRO").

$$y11'' = (I1''/E1'')_{E2''=0} \tag{5}$$

$$y12'' = -(I2''/E1'')_{E2''=0} \tag{6}$$

Since $I1'' \neq -I2''$ as suggested in FIG. 4, it is understood from the equations (2) and (3) that the y-parameters $y11''$ and $y12''$ of the inductor L0 have the following relation.

$$y11'' \neq y12'' \tag{7}$$

The y-parameters y11 and y12 of the parallel resonant circuit 4 are given as follows (see the equation 2.28 in the Japanese book "DENSO KAIRO").

$$y11 = y11' + y11'' \tag{8}$$

$$y12 = y12'' + y12'' \tag{9}$$

When the capacitance of the capacitor C0, the inductance of the inductor L0, and the frequency satisfy certain conditions, the y-parameter $y12'$ of the capacitor C0 is equal to the y-parameter $y12''$ of the inductor L0 multiplied by $-1$. Specifically, at the point "C" in FIG. 2, $y12' = -y12''$, and hence the equation (9) is changed into the following equation.

$$y12 = 0 \tag{10}$$

The equations (4), (7), and (8) are combined, and thus the following relation is derived.

$$y11 = y12' + y11'' \neq y12' + y12'' = 0 \tag{11}$$

It is known that the y-parameters and the S-parameters have the following relations (see the Japanese book "DENSO KAIRO").

$$y11 = \frac{1}{\Delta y} \cdot \{(1 - S11)(1 + S22) + S12 \cdot S21\} \frac{1}{W1} \tag{12}$$

-continued $$y12 = \frac{1}{\Delta y} \cdot \left(-2 \cdot S12 \cdot \frac{1}{W1}\right) \tag{13}$$

where W1 denotes the input characteristic impedance which is equal to 50 Ω, and $\Delta y=(1+S11)(1+S22)-S21 \cdot S12 \neq \infty$ (14). Combination of the equations (10) and (13) results in the following equation.

$$y12 = \frac{1}{\Delta y} \cdot \left(-2 \cdot S12 \cdot \frac{1}{W1}\right) = 0 \tag{15}$$

Thus, the S-parameter S12 is given as:

$$S12 = 0 \tag{16}$$

Since the parallel resonant circuit 4 is symmetrical, the following relation is satisfied.

$$S11 = S22 \tag{17}$$

The equations (11) and (12) are combined into the following equation.

$$y11 = \frac{1}{\Delta y} \cdot \{(1 - S11)(1 + S22) + S12 \cdot S21\} \frac{1}{W1} \neq 0 \tag{18}$$

Combination of the equations (16), (17), and (18) results in the following relation.

$$\{1-(S11)^2\} \neq 0 \tag{19}$$

Thus, the following relations are obtained.

$$S11 \neq 1 > 0° \tag{20}$$

$$S22 \neq 1 > 180° \tag{21}$$

where "1>0°" denotes the point in the Smith chart which is separated from the center by a distance of 1 and which has an angular location of 0°. In addition, "1>180°" denotes the point in the Smith chart which is separated from the center by a distance of 1 and which has an angular location of 180°. The equations (1), (16), (17), (20), and (21) are combined, and thereby the following relation is given.

$$\Gamma 2 = S11 \neq 1 \angle 0° \tag{22}$$
$$\neq 1 \angle 180°$$

It is understood from the relation (22) that the admittance Γ2; of the series combination of the resistor R1 and the parallel resonant circuit 4 is independent of the reflection coefficient Γ4 of the resistor R1 at the point "C" in FIG. 2. Accordingly, there is a certain frequency at which the admittance Γ2 remains unchanged when the resistor R1 is connected to the parallel resonant circuit 4.

Thus, according to an assumed stabilizing circuit composed of only a parallel resonant circuit and a damping resistor, the admittance of the stabilizing circuit can not be within the constant-conductance circle (that is, the good stability region) 20 at frequencies of possible oscillation of a microwave amplifier in the range from the point "C" to the point "D" in FIG. 2.

In this embodiment, the resistor R2 is further connected in series with the series combination of the parallel resonant circuit 4 and the resistor R1 so that the admittance Γ3 of the stabilizing circuit 2 can be within the constant-conductance circle (that is, the good stability region) 20 at frequencies of possible oscillation of the amplifier.

Specifically, the admittance Γ3 of the stabilizing circuit 2 is given as:

$$\Gamma 3 = S11' + (S12' \cdot S21' \cdot \Gamma 2)/(1 - S22' \cdot \Gamma 2) \tag{23}$$

where S11', S12', S21', and S22' denote S-parameters of the resistor R2. When the resistances of the resistors R1 and R2 are suitably chosen, the admittance which occurs in the amplifier oscillation frequency range from the point "C" to the point "D" can be within the constant-conductance circle (that is, the good stability region) 20 as denoted by an admittance locus 26 in FIG. 2.

Different conductances necessary for stabilization are present at respective frequencies of possible oscillation. The greatest one of the conductances is used in setting the constant-conductance circle (that is, the good stability region) 20, and then the resistances of the resistors R1 and R2 are chosen so that the admittance locus 26 from the point "C" to the point "D" can be within the constant-conductance circle (that is, the good stability region) 20. In this case, the amplifier can be reliably prevented from oscillating.

DESCRIPTION OF THE SECOND PREFERRED EMBODIMENT

Figure 5:
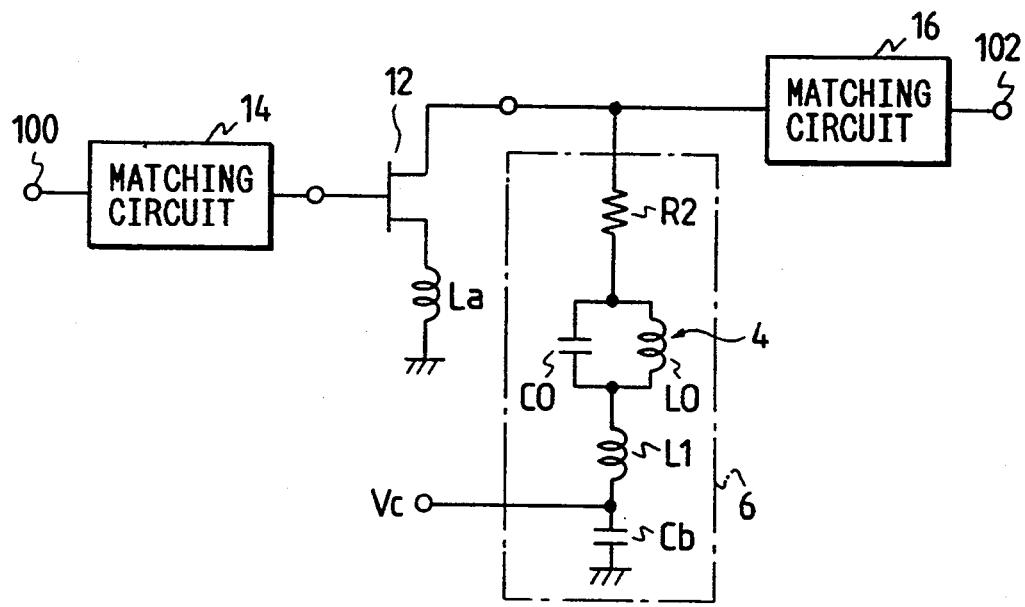
FIG. 5 is a diagram of a microwave amplifier according to a second embodiment of this invention.

FIG. 5 shows a second embodiment of this invention which is similar to the embodiment of FIG. 1 except for design changes indicated hereinafter. The connection between the drain of an FET 12 and a power supply line via an inductor Lb (see FIG. 1) is removed from the embodiment of FIG. 5.

In the embodiment of FIG. 5, a stabilizing circuit 6 is connected to the drain of the FET 12. The stabilizing circuit 6 serves to prevent unwanted oscillation of the amplifier without impairing the amplification characteristics thereof.

The stabilizing circuit 6 includes a fixed resistor R2, capacitors C0 and Cb, and inductors L0 and L1. The capacitor C0 and the inductor L0 are connected in parallel to compose a parallel resonant circuit 4. The resonance frequency of the parallel resonant circuit 4 is preset to a given frequency f0 which agrees with the frequency of a microwave signal handled by the amplifier. A first junction between the capacitor C0 and the inductor L0 is connected via the resistor R2 to the drain of the FET 12. A second junction between the capacitor C0 and the inductor L0 is connected to one end of the inductor L1. The other end of the inductor L1 is connected to one end of the capacitor Cb. The other end of the capacitor Cb is grounded. The junction between the inductor L1 and the capacitor Cb is connected to a power supply line (bias supply line) subjected to a power supply voltage (bias voltage) Vc. The capacitor Cb serves to shunt or short-circuit the end of the inductor L1 to the ground with respect to microwave or high-frequency signals.

Figure 6:
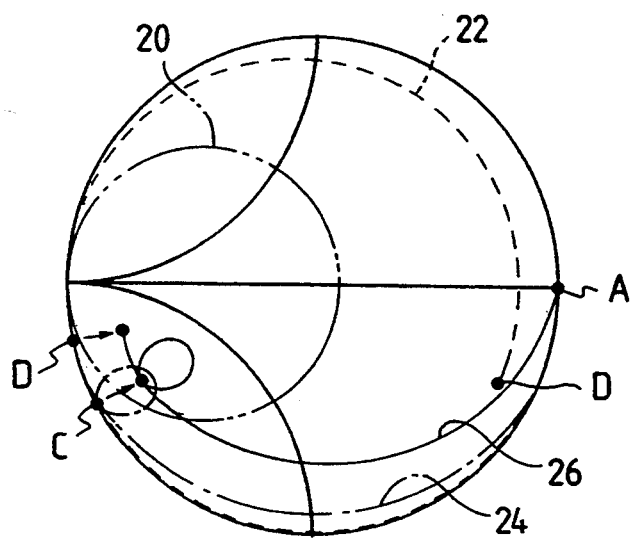
FIG. 6 is an admittance Smith chart in the amplifier of FIG. 5.

The admittance of the series combination of the parallel resonant circuit 4 and the inductor L1 is denoted by the admittance locus 24 in FIG. 6. Because of the presence of the resistor R2 connected to the series combination of the parallel resonant circuit 4 and the inductor L1, the admittance of the stabilizing circuit 6 is denoted by an admittance locus 26 in FIG. 6. Thus, the admittance which occurs in an amplifier oscillation frequency range from the point "C" to the point "D" exists within a constant-conductance circle (that is, a good stability region) 20 in FIG. 6. As a result, unwanted oscillation of the amplifier can be prevented without impairing the amplification characteristics thereof.

DESCRIPTION OF THE THIRD PREFERRED EMBODIMENT

Figure 7:
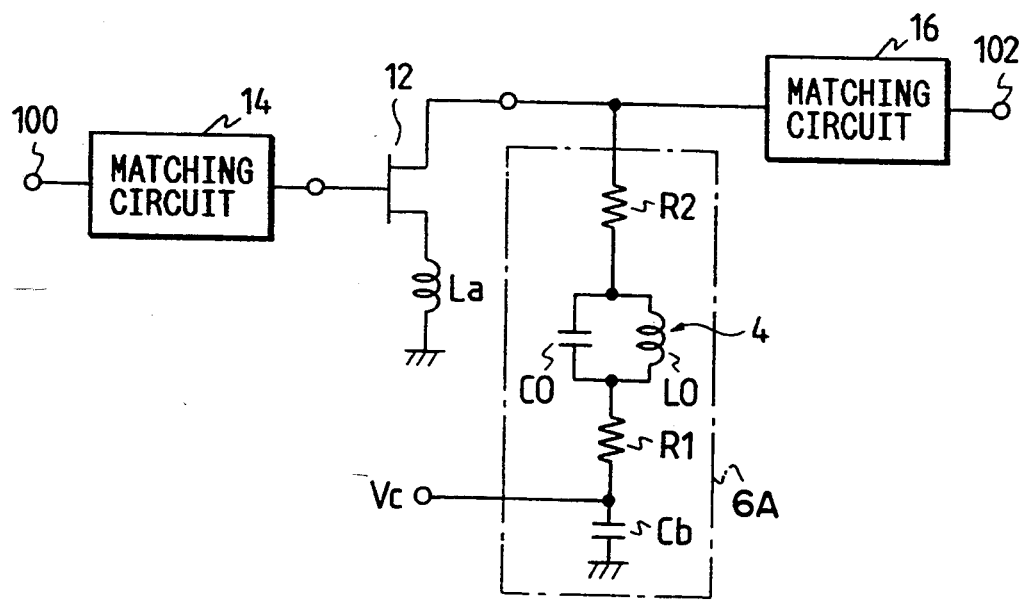
FIG. 7 is a diagram of a microwave amplifier according to a third embodiment of this invention.

FIG. 7 shows a third embodiment of this invention which is similar to the embodiment of FIG. 5 except that the stabilizing circuit 6 (see FIG. 5) is modified into a stabilizing circuit 6A which has a resistor R1 instead of the inductor L1 (see FIG. 5).

DESCRIPTION OF THE FOURTH PREFERRED EMBODIMENT

Figure 8:
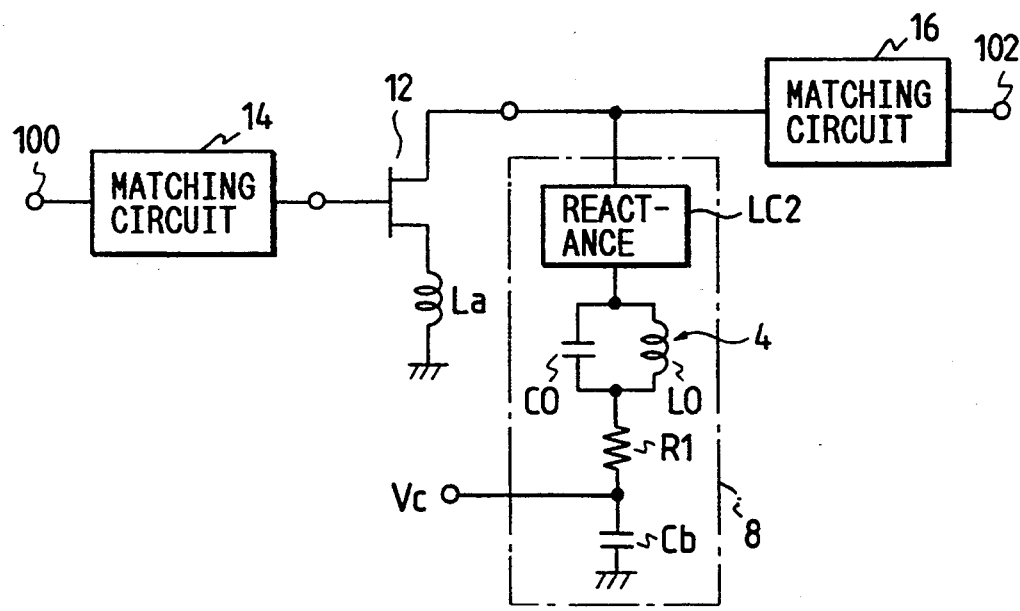
FIG. 8 is a diagram of a microwave amplifier according to a fourth embodiment of this invention.

FIG. 8 shows a fourth embodiment of this invention which is similar to the embodiment of FIG. 7 except that the stabilizing circuit 6A (see FIG. 7) is modified into a stabilizing circuit 8 which has a reactance element LC2 instead of the resistor R2 (see FIG. 7).

Figure 9:
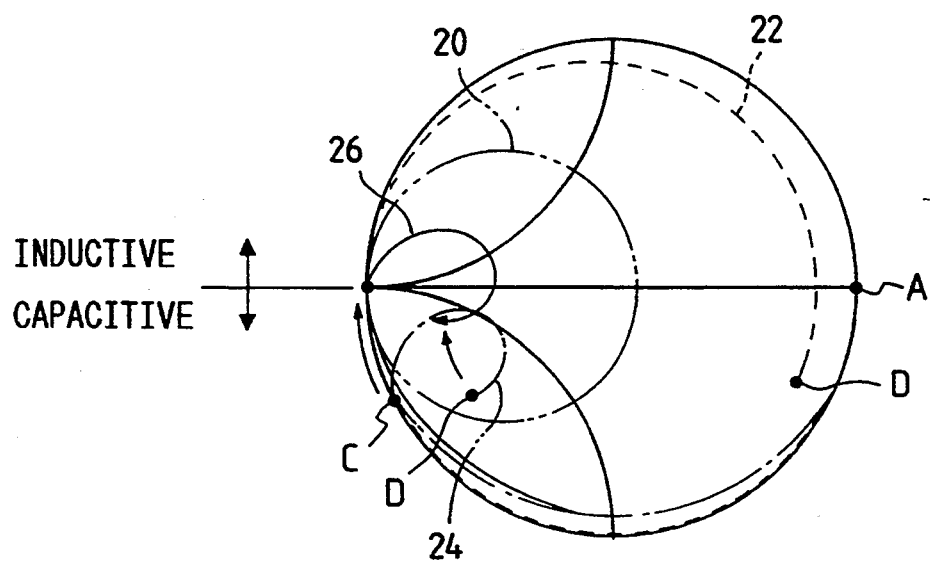
FIG. 9 is an admittance Smith chart in the amplifier of FIG. 8.
Figure 10:
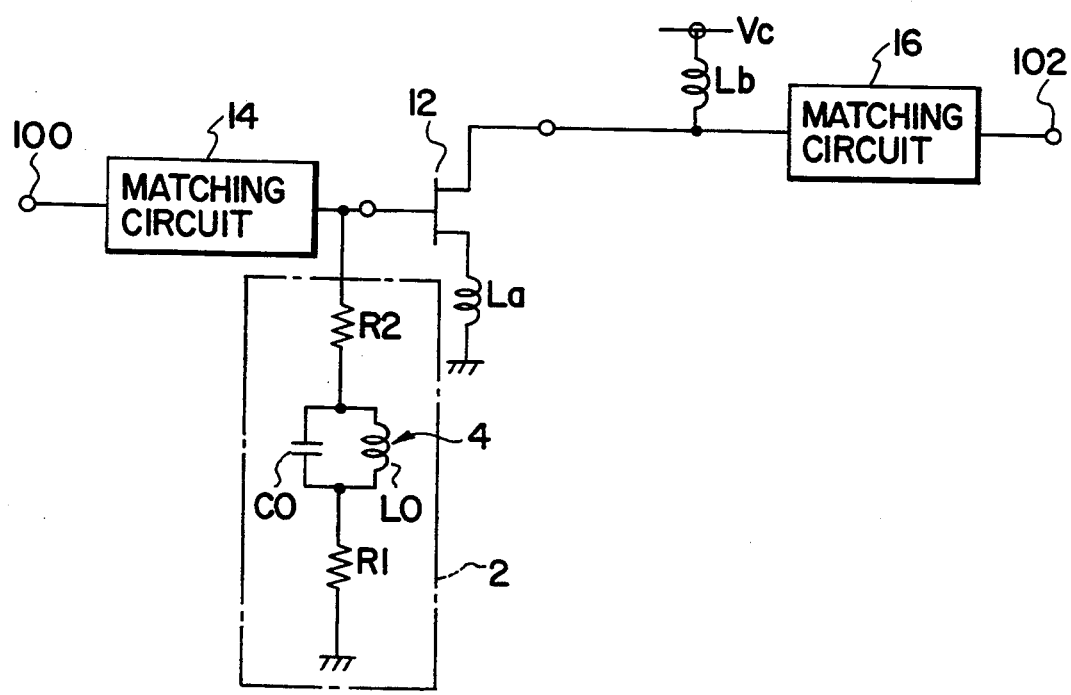
FIG. 10 is a diagram of a modification of the amplifier of FIG. 1.

With reference to FIG. 9, in the case where the point "C" on a locus of the admittance of a series combination of a resistor R1 and a parallel resonant circuit 4 is capacitive, an inductor is used as the reactance element LC2 so that the point "C" can be moved into a constant-conductance circle (that is, a good stability region) 20. In the case where the point "C" on the locus of the admittance of the series combination of the resistor R1 and the parallel resonant circuit 4 is inductive, a capacitor is connected thereto so that the point "C" can be moved into the constant-conductance circle (that is, the good stability region) 20. As a result, unwanted oscillation of the amplifier can be prevented without impairing the amplification characteristics thereof. This modification of the amplifier of FIG. 1 is shown in FIG. 10.

DESCRIPTION OF OTHER PREFERRED EMBODIMENTS

Each of the amplifiers of FIGS. 1, 5, 7, and 8 can be modified into a design which has a bipolar transistor instead of the FET 12. In addition, each of the amplifiers of FIGS. 1, 5, 7, and 8 can be modified into a design suited to amplification of a signal in a frequency band, such as a VHF band or a UHF band, other than a microwave frequency band. Furthermore, each of the amplifiers of FIGS. 1, 5, 7, and 8 can be modified into a design in which the stabilizing circuit 2, 6, 6A, or 8 is connected to the input side of the FET 12 rather than the output side thereof. Also, each of the amplifiers of FIGS. 1, 5, 7, and 8 can be modified into a design in which another stabilizing circuit is added to the input side of the FET 12.

What is claimed is:

1. A stabilizing circuit for a high-frequency amplifier having a semiconductor element for amplifying a high-frequency signal, an input matching circuit connected to an input side of the semiconductor element, and an output matching circuit connected to an output side of the semiconductor element, the stabilizing circuit being connected to at least one of a signal input path between the input matching circuit and the semiconductor element and a signal output path between the semiconductor element and the output matching circuit, the stabilizing circuit comprising:

a first element having a first end which is short-circuited to a ground with respect to a high frequency signal;

a parallel resonant circuit connected in series with a second end of the first element and performing parallel resonance at an operating frequency of the high-frequency amplifier; and a second element connected to a side of the parallel resonant circuit which is opposite to the first element;

wherein values of the first element and the second element are chosen so that an admittance of the high-frequency amplifier which occurs at a frequency of possible oscillation of the high-frequency amplifier will be within a constant-conductance circle in a Smith chart which denotes a stable condition of the high-frequency amplifier.

2. The stabilizing circuit of claim 1, wherein the first element comprises a resistor.

3. The stabilizing circuit of claim 1, wherein the first element comprises an inductor.

4. The stabilizing circuit of claim 1, wherein the second element comprises a resistor.

5. The stabilizing circuit of claim 1, wherein the second element comprises a reactance element.

6. The stabilizing circuit of claim 1, wherein the parallel resonant circuit comprises an inductor and a capacitor.

7. The stabilizing circuit of claim 1, wherein the first element is short-circuited via a capacitor with respect to a high frequency signal.

8. A microwave amplifier comprising:

an FET having a source and a drain;

an output matching circuit connected to the drain of the FET; and a stabilizing circuit including a first element, a second element and a parallel resonant circuit, the first element being composed of one of a resistor and an inductor, the second element being composed of one of a resistor and an inductor and having a first terminal and a second terminal, the parallel resonant circuit having a first terminal and a second terminal, the first terminal of the parallel resonant circuit being connected to a junction between the drain of the FET and the output matching circuit via the first element, the second terminal of the parallel resonant circuit being connected to the first terminal of the second element, the second terminal of the second element and the source of the FET being grounded, and the parallel resonant circuit being tuned to a predetermined microwave frequency.

9. A stabilizing circuit for a high-frequency amplifier having a semiconductor element for amplifying a high-frequency signal, an input matching circuit connected to an input side of the semiconductor element, and an output matching circuit connected to an output side of the semiconductor element, the stabilizing circuit being connected to a signal line between the input matching circuit and the output matching circuit, the stabilizing circuit comprising:

a first element having a first end which is short-circuited to a ground with respect to a high frequency;

a parallel resonant circuit connected in series with a second end of the first element and performing parallel resonance at an operating frequency of the high-frequency amplifier; and a second element connected to a side of the parallel resonant circuit which is opposite to the first element;

wherein parameters of the first element and the second element are chosen so that an admittance of the stabilizing circuit which occurs at a possible oscillation frequency of the high-frequency amplifier will be within a constant-conductance circle in a Smith chart which denotes a stable condition of the high-frequency amplifier.

10. A stabilizing circuit for a high-frequency amplifier having a semiconductor element for amplifying a high-frequency signal, an input matching circuit connected to an input side of the semiconductor element, and an output matching circuit connected to an output side of the semiconductor element, the stabilizing circuit being connected to a signal line between the input matching circuit and the input side of the semiconductor element, the stabilizing circuit comprising:

a first element having a first end which is short-circuited to a ground with respect to a high frequency;

a parallel resonant circuit connected in series with a second end of the first element and performing parallel resonance at an operating frequency of the high-frequency amplifier; and a second element connected to a side of the parallel resonant circuit which is opposite to the first element;

wherein parameters of the first element and the second element are chosen so that an admittance of the stabilizing circuit which occurs at a possible oscillation frequency of the high-frequency amplifier will be within a constant-conductance circle in a Smith chart which denotes a stable condition of the high-frequency amplifier.

* * * * *